US012796154B2

(12) United States Patent
Heilig et al.

(10) Patent No.: US 12,796,154 B2
(45) Date of Patent: Nov. 10, 2026

(54) DOPING OF A SILICON SUBSTRATE BY LASER DOPING WITH A SUBSEQUENT HIGH-TEMPERATURE STEP

(71) Applicant: UNIVERSITÄT KONSTANZ, Constance (DE)

(72) Inventors: Matthias Leo Heilig, Constance (DE); Daniel Wurmbrand, Constance (DE); Barbara Terheiden, Constance (DE)

(73) Assignee: UNIVERSITÄT KONSTANZ, Constance (DE)

( * ) Notice: Subject to any disclaimer, the term of this patent is extended or adjusted under 35 U.S.C. 154(b) by 0 days.

(21) Appl. No.: 18/692,997

(22) PCT Filed: Sep. 17, 2021

(86) PCT No.: PCT/EP2021/075723
§ 371 (c)(1),
(2) Date: Mar. 18, 2024

(87) PCT Pub. No.: WO2023/041177
PCT Pub. Date: Mar. 23, 2023

(65) Prior Publication Data

US 2024/0379894 A1 Nov. 14, 2024

(51) Int. Cl.
*H10F 71/00* (2025.01)
*H10F 19/80* (2025.01)
*H10F 77/1223* (2025.01)

(52) U.S. Cl.
CPC ......... *H10F 71/121* (2025.01); *H10F 19/807* (2025.01); *H10F 71/128* (2025.01); *H10F 71/129* (2025.01); *H10F 77/1223* (2025.01)

(58) Field of Classification Search
CPC .. H10F 71/121; H10F 77/1223; H10F 71/128; H10F 71/129
See application file for complete search history.

(56) References Cited

U.S. PATENT DOCUMENTS 7,135,350 B1 * 11/2006 Smith .................... H10F 10/146 438/57
2011/0303280 A1 * 12/2011 Pawlak ................. H10F 77/219 257/E31.124

(Continued)

FOREIGN PATENT DOCUMENTS

WO 2014137284 A1 9/2014
WO 2016001132 A1 1/2016

OTHER PUBLICATIONS

Kern et al., "Chemically Vapor-Deposited Borophosphosilicate Glasses for Silicon Device Applications", RCA Review, RCA Research and Engineering, Sep. 1982, vol. 43, No. 3, pp. 423-457.

(Continued)

*Primary Examiner* — Sadie White
(74) *Attorney, Agent, or Firm* — Maier & Maier, PLLC

(57) ABSTRACT

A method for doping a silicon substrate, in particular for a solar cell, includes coating a surface of the silicon substrate with a layer stack composed of at least two glass layers such that the layer stack at least covers a first region to be doped and a second region to be doped of the silicon substrate. the layer stack includes a first glass layer containing boron as p-type dopant and a second glass layer containing phosphorus as n-type dopant; and irradiating the first region covered with the layer stack with laser radiation such that dopant predominantly from the glass layer of the two glass layers that is closer to the surface of the silicon substrate than the other of the two glass layers is introduced into the silicon substrate close to the surface.

13 Claims, 8 Drawing Sheets

(56) References Cited

U.S. PATENT DOCUMENTS

| | | | | |
|---|---|---|---|---|
| 2011/0315186 | A1* | 12/2011 | Gee | H10F 71/139<br>257/E31.13 |
| 2014/0090701 | A1* | 4/2014 | Rim | H10F 77/703<br>136/258 |
| 2014/0166093 | A1* | 6/2014 | Loscutoff | H10F 77/148<br>438/71 |
| 2014/0251817 | A1* | 9/2014 | Vais | C25D 17/10<br>257/734 |
| 2015/0017747 | A1 | 1/2015 | Lam et al. | |
| 2015/0040974 | A1* | 2/2015 | Naber | H10F 10/146<br>438/96 |
| 2015/0075595 | A1 | 3/2015 | Gall | |
| 2015/0349180 | A1* | 12/2015 | Smith | H10F 77/1223<br>438/97 |
| 2015/0380598 | A1* | 12/2015 | Loscutoff | H10F 77/311<br>136/255 |
| 2016/0020343 | A1 | 1/2016 | Carlson | |
| 2017/0084770 | A1 | 3/2017 | Loscutoff et al. | |
| 2017/0133538 | A1* | 5/2017 | Gloger | H10F 71/121 |
| 2017/0141254 | A1* | 5/2017 | Young | H10F 77/315 |

OTHER PUBLICATIONS

Dahlinger et al., “Laser-Doped Back-Contact Solar Cells”, IEEE Journal of Photovoltaics, IEEE, May 1, 2015, vol. 5, No. 3, pp. 812-818.

International Search Report issued on May 16, 2022, in corresponding International Application No. PCT/EP2021/075723; 6 pages.

* cited by examiner

DOPING OF A SILICON SUBSTRATE BY LASER DOPING WITH A SUBSEQUENT HIGH-TEMPERATURE STEP

FIELD

The present invention relates to a method for doping a silicon substrate, in particular for a solar cell. The invention also relates to a method for producing a solar cell, using a silicon substrate doped in the aforementioned method, and also to a solar cell comprising a silicon substrate doped in this way.

BACKGROUND

Silicon substrates are used for a variety of applications. For example, solar cells or other electronic components may be produced using silicon substrates in the form of a wafer or thin layer. For this purpose, various sub-regions are produced in the silicon substrate, usually adjoining the surface thereof, and those sub-regions differ in regard of the dopant types and/or dopant concentrations introduced therein. Dopants that generate free-moving negative charges, i.e. electrons, for example phosphorus, may be designated n-type dopants in accordance with their polarity. Conversely, dopants that generate positive charges, i.e. holes, for example boron, may be designated p-type dopants in accordance with their polarity. Depending on the dopant and dopant concentration with which a sub-region is predominantly doped, an electric potential forms in a sub-region which adjoins a differently-doped sub-region, because of charge carrier diffusion. By appropriately arranging the sub-regions for a specific semiconductor component, it is possible to generate potential differences, for example in the form of p-n junctions, at transitions between the sub-regions, and thereby produce desired functions.

Hereinafter, embodiments of the invention will be predominantly described with reference to a silicon substrate for producing a solar cell, since advantages made possible by the invention may be particularly effectively utilized in the production of solar cells. However, embodiments of the invention may also be used to produce silicon substrates for other applications, for example microelectronics components, power semiconductor components, components of storage technology and the like.

Solar cells are used as photovoltaic elements for converting light into electrical energy. For this purpose, various doped sub-regions are provided in a semiconductor substrate, for example a silicon wafer. The different types or densities of free charge carriers within the various sub-regions lead to the development of a potential difference at interfaces between adjacent sub-regions. Charge carrier pairs which have been generated in the vicinity of these interfaces by the absorption of light may be spatially separated by means of such a potential difference.

There are numerous solar cell concepts according to which differently-doped sub-regions of suitably adapted geometries may be generated in a silicon substrate in order to achieve desired functionalities, for example efficient collection of generated charge carriers, reduced shadowing by metal contacts on a surface of the solar cell facing toward the sun, or the possibility of good passivation of surfaces of the solar cell. For example, back-contact solar cells have been developed in which both contact types, i.e. contacts which contact p-type regions and contacts which contact n-type regions, are arranged on the back side of the silicon substrate, thus preventing contact-induced shadowing on the side of the solar cell facing toward the sun and affording the possibility of highly efficiently passivating the front-side surface of the silicon substrate, in particular. Examples of such back-contact solar cells are IBC (interdigitated back contact) solar cells in which contact fingers for contacting both polarities are arranged interleaved with one another on the back-side surface of the silicon substrate.

In the context of producing silicon solar cells, there are different methods to generate differently-doped sub-regions in a silicon substrate.

For example, the sub-regions which are intended to be doped with a specific dopant may be exposed, in a furnace at high temperatures, to an atmosphere containing this dopant, such that the dopant may accumulate at the surface of the silicon substrate and diffuse into the silicon substrate. Sub-regions of the silicon substrate that are not intended to be doped in this process may be protected from the accumulation and diffusing-in of dopants using for example a masking layer, for example. Layers of a suitable thickness made of silicon oxide or silicon nitride may be used, for example, as masking layers. Doped sub-regions of different polarity may generally be generated in a silicon substrate by the silicon substrate being exposed to a succession of different atmospheres containing different dopants, with each of the sub-regions which are not to be doped being masked beforehand. Doped sub-regions of the same polarity but of different dopant concentrations and hence different electrical conductivity may for example be generated by dopants first being homogeneously diffused-in over the whole region, and individual sub-regions being subsequently etched back.

Alternatively, differently-doped sub-regions may be generated by, for example, applying layers charged with dopants to the surface of the sub-regions to be doped and then heating the silicon substrate including the layers applied thereto, in order to cause the dopants to diffuse out of the layers and into the silicon substrate.

WO 2016/001132 A1 describes a method for generating differently-doped regions in a silicon substrate, in particular for a solar cell.

SUMMARY

There may be a need for an alternative method for doping a silicon substrate which has considerably fewer steps than conventional doping methods. In particular, there may be a need for a method for doping a silicon substrate that does away with the need for any masking steps. There may further be a need for a method for producing a solar cell using such a doped silicon substrate, and also for a solar cell comprising such a doped silicon substrate. The aforementioned methods may be carried out simply. In particular, it is possible to produce two, three or more than three differently-doped regions in the same silicon substrate and in the same process.

The subject matter of the independent claims makes it possible to meet this need. Advantageous embodiments are given in the dependent claims, the description that follows, and the appended figures.

A first aspect of the invention relates to a method for doping a silicon substrate, in particular for a solar cell, hereinafter also referred to as doping method. The method comprises at least the following steps which may be carried out in the stated order: (i) coating a surface of the silicon substrate with a layer stack composed of at least two glass layers such that the layer stack at least covers a first region to be doped and a second region to be doped of the silicon substrate, wherein the layer stack comprises a first glass layer containing boron as p-type dopant and a second glass layer containing phosphorus as n-type dopant; (ii) irradiating the first region covered with the layer stack with laser radiation such that dopant predominantly from the glass layer of the two glass layers that is closer to the surface of the silicon substrate than the other of the two glass layers is introduced into the silicon substrate close to the surface, and the layer stack is ablated in order to obtain a doped first region from which the layer stack is ablated, wherein the second region covered with the layer stack is not irradiated with the laser radiation and thus the layer stack is not ablated in said second region; and subsequently (iii) heating the silicon substrate in a furnace to a temperature of at least 700° C., such that dopant predominantly from one of the two glass layers is introduced into the silicon substrate close to the surface, in order to obtain a doped second region, the doping of which differs with regard to its polarity and/or doping concentration from a doping of the doped first region.

The silicon substrate may for example be a silicon wafer, i.e. a slice of monocrystalline, multicrystalline or polycrystalline silicon which is typically at least 100 μm thick. Alternatively, the silicon substrate described here may however also be a thin layer, i.e. a layer of crystalline or amorphous silicon which is typically between 5 nm and 50 μm, usually between 0.5 μm and 20 μm, thick. In a specific embodiment, the silicon substrate may be a layer for example between 10 nm and 1 μm, in particular between 20 nm and 200 nm, thick, such as may be used for example in heterojunction solar cells for forming passivated contacts. In particular, the silicon substrate described here may be a self-contained, preferably self-supporting substrate or may be supported as a thin layer by another substrate.

The silicon substrate may be coated for example by chemical vapor deposition, for example APCVD (atmospheric pressure chemical vapor deposition) or PECVD (plasma-enhanced chemical vapor deposition), by sputtering, by vapor coating, for example by means of an electron beam, by growth in a diffusion furnace or by a combination of at least two of these examples. The at least two glass layers of the layer stack deposited on the silicon substrate by the coating process may be influenced in terms of their physical and chemical properties by parameters such as those set during the coating process. For example, a chemical composition of a glass layer, and a type and concentration of dopants contained in a glass layer, may be influenced for example by appropriately choosing material sources and/or process parameters such as, inter alia, process temperatures, deposition durations, gas flows, etc. A thickness of glass layers may also be influenced in a targeted manner by the targeted selection of process parameters. The plurality of glass layers of the layer stack may preferably be deposited in a common deposition process and/or by means of a common deposition device.

"Glass layer" may mean a layer containing significant amounts of an element that dopes silicon, i.e. a dopant, wherein atoms or generally particles of the dopant may be incorporated in a (glass) material that forms the glass layer. Usually, the amount of dopant only constitutes a certain proportion of the glass layer, for example with concentrations in the range from 1e18 $cm^{-3}$ to 2e22 $cm^{-3}$. As soon as the atoms or particles diffuse into adjacent semiconductor material, they cause doping therein as electrically active impurities and thus change the electrical behavior of the semiconductor material. The glass layer may for example be designed as a dielectric layer in which dopant is incorporated in a dielectric, for example silicon oxide, silicon nitride or silicon carbide. The first glass layer may for example be a borosilicate glass layer. The second glass layer may for example be a phosphosilicate glass layer.

The irradiation with the laser radiation of the first region covered with the layer stack is a process step which is intended to cause specifically sought-after properties and effects for the doping method described herein, and during which step properties of the laser radiation used here should be specifically selected and/or adjusted. The irradiation is intended inter alia to take place such that the silicon substrate is locally melted at the surface for a short duration. As a result, the locally adjoining region of the layer stack is also at least partially or fully melted. This causes liquid-phase diffusion, during which dopant diffuses out of the molten part of the glass layer(s) and into the silicon substrate. In particular, in the doping method described herein, the irradiation with laser radiation is intended to take place such that dopant predominantly from just one of the melted glass layers, in particular from the glass layer of the two glass layers of the layer stack that is closer to the silicon substrate, diffuses into the melted silicon substrate up to a certain penetration depth. The term "predominantly" may be understood here to mean that, although it is possible for dopants from both of the glass layers to enter the silicon substrate, an amount of dopant transferred from one of the glass layers into the silicon substrate is substantially larger (i.e. for example by a multiple or even by one or more orders of magnitude) than an amount of dopant transferred from the other of the glass layers into the silicon substrate. The predominantly diffused-in dopant thus dominates the properties of the region of the silicon substrate doped therewith, and some other dopants, for example those originating from the other glass layer, are overcompensated in terms of their doping effect. In this context, the term "close to the surface" or "at the surface" may mean for example a maximum penetration depth of 10 nm, 100 nm, 1 μm, 5 μm or 10 μm, it being possible for the maximum penetration depth to vary depending on the overall thickness of the silicon substrate in question. In any case, the layer close to the surface which is to be doped, at least in cases in which the silicon substrate is a wafer, is considerably thinner than the thickness of the whole silicon substrate.

If the silicon substrate is to be used for a solar cell, it is expedient if only a first side of the silicon substrate, which is intended to act as the back side of the solar cell, for example, and not additionally a second side of the silicon substrate, which is opposite the first side and is intended to act for example as the front side of the solar cell, is coated with the layer stack and irradiated with the laser radiation. Nevertheless, it is possible for both the first side and the second side to be coated with the layer stack and irradiated with the laser radiation.

The layer stack may be irradiated with the laser radiation by means of an individual laser or using two or more lasers. By selecting suitable laser parameters, it is possible to ensure that the energy density or fluence of the laser radiation is just high enough that, shortly after the initial local melting of the silicon substrate surface and of the adjacent region of the layer stack, local ablation of the layer stack begins without leading to substantial and in particular irreversible functionally-relevant damage to the silicon substrate. Expediently, the process of irradiation with the laser radiation may be controlled such that the laser-induced processes described herein of doping the silicon substrate and of ablating the layer stack occur in the same laser treatment step, one slightly after the other in time, such that a sufficient amount of dopant enters the silicon substrate from the glass layer before the layer stack is completely removed. To this end, laser parameters, for instance energy density, wavelength and pulse duration of the laser or lasers used may be adjusted such that the silicon substrate surface and the adjacent region of the layer stack are initially temporarily melted in a region of a laser spot for long enough that liquid-phase diffusion of dopants from at least one of the glass layers into the silicon melted close to the surface may occur. In this case, the liquid phase should exist, for example, for at least a few nanoseconds or a few microseconds, for example between 1 ns and 10 μs, typically between 1 μs and 2 μs. This causes a penetration depth of typically 1 nm to 10 μm, preferably in particular in silicon substrates in the form of silicon wafers, of between 0.1 μm and 3 μm, the penetration depth corresponding substantially to a thickness of the ultimately-doped silicon layer close to the surface which forms after the molten silicon has solidified. Furthermore, the laser parameters should be adjusted such that local ablation of the layer stack occurs shortly after, i.e. for example 10 ps to 100 ns, preferably 5 ns to 50 ns, after said melting has begun. The ablation may for example occur by the local absorption of laser energy leading to the formation of a gas phase, as a result of which a region of the glass layer stack lying thereabove is “blown out”. The suitable choice of the laser parameters is dependent on various influencing factors, inter alia on the physical properties of the glass layers in the layer stack, e.g. the composition or thickness thereof, and should generally be optimized.

The laser radiation used for the irradiation of the first region may be emitted by an individual laser. The laser parameters may be suitably adjusted such that an individual laser pulse or a sequence of laser pulses leads to the described sequential melting and ablation. The laser may for example be a suitably operated nanosecond laser or picosecond laser.

Alternatively, the laser radiation may be generated using two or more than two lasers. The lasers may emit their laser radiation in a manner spatially focused on a common region and/or suitably synchronized in time, or may irradiate the region one after the other. For example, a first laser may emit laser radiation that melts the silicon substrate close to the surface. To this end, use may be made for example of a nanosecond laser. In addition, a second laser may emit laser radiation that leads to ablation of the laser stack, for example because of a higher power density compared to the first laser. The second laser may for example be a picosecond laser.

In contrast to the irradiation of the doped layer stack with laser radiation, the heating of the silicon substrate in the furnace after the laser treatment causes solid-state diffusion, in which the dopant diffuses either predominantly out of the (solid or partly softened or viscous) first glass layer or predominantly out of the (solid or partly softened or viscous) second glass layer and into the (solid) silicon substrate, either directly or through the respective other glass layer and/or through one or more optional further layers of the layer stack.

A second aspect of the invention relates to a method for producing a solar cell, hereinafter also referred to as production method. The method comprises at least the following steps: providing a silicon substrate comprising a doped first region and a doped second region, wherein the silicon substrate was doped in the method for doping a silicon substrate described above and below; forming a first contact structure which electrically conductively contacts the doped first region; and forming a second contact structure which electrically conductively contacts the doped second region. This considerably simplifies the production of a solar cell, for example a back-contact solar cell.

The contact structures may be configured as metal contacts, in particular as thin elongate contact fingers. Alternatively, the contact structures may be formed using other electrically conductive materials, for example highly-doped semiconductor layers. The production method may comprise additional steps, for example surface passivation, back-etching of the doped surface by for example 10 nm to 200 nm, or deposition of an anti-reflective layer. For the purposes of surface passivation, for example, a passivating dielectric layer may be applied to the surface of the silicon substrate. In the process, the remaining part of the layer stack that was not ablated by the laser radiation may optionally be removed beforehand from the ready-doped silicon substrate. The production method may further comprise additional process steps, for example cleaning steps, etching steps or other process steps such as those which are used in a known manner in the manufacture of solar cells.

A third aspect of the invention relates to a solar cell comprising a silicon substrate comprising a first region and a second region laterally adjacent to the first region, each of said regions adjoining a surface of the silicon substrate. A doping within the second region differs here from a doping within the first region with respect to a type and/or concentration of dopants. The first region has doping with a dominant dopant type and also doping with an overcompensated dopant type. Both a dopant concentration of the dominant dopant type and a dopant concentration of the overcompensated dopant type is higher within the first region than a base doping of the silicon substrate. Close to the surface, the first region has a topography and/or crystalline structure which results characteristically from a temporary melting and re-solidifying of material of the silicon substrate.

The solar cell may in particular be generated using the doping and production methods described herein. The first region and the second region may have properties that result characteristically because of the method. Both regions, each of which are adjacent to the surface of the solar cell on the same side and are arranged adjacent to one another, differ in the type and/or concentration of dopants they contain. In particular, one of the regions may be predominantly n-type doped, and the other region may be predominantly p-type doped.

In particular, the first region may have properties that result from the doping as a consequence of the irradiation of the layer stack with the laser radiation. Such doping takes place predominantly by temporary melting of silicon from the silicon substrate and also by liquid-phase diffusion, and leads to characteristic properties of the topography and/or crystalline structure close to the surface of the silicon substrate in the first region, and also to characteristic doping profiles. The topography close to the surface of the silicon substrate has properties such as those which typically result when the silicon substrate is temporarily melted close to the surface during the irradiation with laser radiation. For example, sharp-edged structures present beforehand on the silicon substrate are typically rounded-off by such melting. Characteristic uneven regions and/or depressions may arise at the edges of a temporarily melted region after solidification. Even a crystalline or amorphous structure of the silicon of the silicon substrate typically changes characteristically by the temporary melting. Furthermore, the irradiation with laser radiation may lead to local changes in the crystalline structure of the silicon substrate, for example in the form of crystal defects generated by absorption.

Within a region of the silicon substrate close to the surface, the doping profiles typically have a concentration profile which is similar to Gaussian distribution and/or approximately rectangular. The region close to the surface corresponds here approximately to the region which is melted during the laser-operated doping and generally extends at least to a depth of 0.05 μm, preferably of 0.3 μm, often to a depth of 0.5 μm, 1 μm or even more than 1 μm, beneath the surface of the silicon substrate.

In the solar cell proposed here, the first region typically has doping with a dominant dopant type and also doping with an overcompensated dopant type. The two dopant types oppose one another; i.e. one of the dopant types is n-type and the other dopant type is p-type. For example, the dominant dopant type in the first region may originate from boron doping and therefore be of p-type, while the overcompensated dopant type may originate from phosphorus doping and therefore be of n-type.

The property of two opposing dopant types being contained in the first region results from the doping method in which dopants are forced from a layer stack, containing for example both a borosilicate glass layer and a phosphosilicate glass layer, into the silicon by laser irradiation such that both dopant types enter the silicon. The fact that the laser parameters are chosen in the process such that the silicon substrate is temporarily melted close to the surface leads to a surface topography of the silicon substrate in the first region that is typical of this type of melting. The fact that the dopant contained in the glass layer closer to the silicon substrate is typically more strongly forced into the silicon upon laser doping than the dopant contained in the glass layer further from the silicon substrate generally also leads to the dominant dopant type in a layer close to the surface of the first region of the silicon substrate being present in considerably higher concentrations than the overcompensated dopant type. This is the case at least for silicon substrates in the form of a thick wafer in a region close to the surface which begins 30 nm beneath the surface of the silicon substrate and ends 100 nm beneath the surface of the silicon substrate. Depending on the process parameters used during the laser doping, the region close to the surface may reach up closer to the surface of the silicon substrate; i.e. it may begin at a depth of less than 30 nm, and/or it may reach deeper into the silicon substrate, i.e. deeper than 100 nm, for example 200 nm, 300 nm, 500 nm or more than 800 nm, ending beneath the surface of the silicon substrate. Directly adjoining the surface of the silicon substrate, i.e. between 0 nm and 30 nm deep, other effects may lead to a dopant distribution that acts differently locally.

Possible features and advantages of embodiments of the invention may be considered, inter alia, and without limiting the invention, to be based on the concepts and knowledge described below.

The doping method described above and below makes it possible, inter alia, to generate laterally adjacent p- and n-doped structures close to the surface in the silicon substrate without needing to mask the silicon substrate. The layer stack used for this purpose, which may comprise a borosilicate glass layer and a phosphosilicate glass layer, serves here as a common doping source both for the boron diffusion by means of laser doping and for the phosphorus diffusion in a diffusion furnace.

For example, the laser process may be used to produce a p-type doping by means of liquid-phase diffusion, and in the same process step the phosphorus doping source may be structured for the subsequent high-temperature step by ablation of the glass layers. In the high-temperature step, phosphorus may then be forced out of the remaining phosphosilicate glass layer through the remaining borosilicate glass layer and into the crystalline silicon substrate. This may take place predominantly by thermally driven solid-state diffusion. Choosing a suitable and sufficiently high temperature in the furnace, for example in a temperature range above 700° C., preferably above 800° C., makes it possible for phosphorus from the phosphosilicate glass layer to diffuse into the adjacent silicon. A lower diffusion coefficient and/or lower solubility of boron in silicon makes it possible to prevent too much boron diffusing into the silicon at the same time. For example, for energy-saving reasons, the high-temperature step may be carried out at temperatures which are not excessively high, for example at at most 1100° C. or at most 1000° C. The previously laser-treated p-type doped regions are generally less influenced by the high-temperature step, because the layer stack initially lying over them is ablated at the same time by the preceding laser doping process. Thus, the laser process forms freely definable lateral p-n structures from a doping glass system which was preferably initially deposited over the whole surface. These p-n structures may be used for example to produce IBC solar cells. As a result, the doping method has the potential to contribute to significant cost reductions for industrial IBC solar cells by virtue of a greatly simplified process.

The doping method is greatly simplified compared to the previous established processes for generating lateral p-n junctions. These processes usually comprise two separate high-temperature steps in the diffusion furnace and various masking and structuring processes, for example photolithography or laser ablation. Corresponding cleaning steps and back-etching of masking layers or regions of undesired doping are associated with these processes.

In contrast to conventional methods, the doping method comprises three essential process steps (i) to (iii), as mentioned above. In step (i), a further glass layer containing dopant, for example a phosphosilicate glass layer, may be additionally deposited on a front side of the silicon substrate by means of chemical vapor deposition, for example as a third glass layer in addition to the first and second glass layers. This phosphosilicate glass layer may serve later as a doping source in the high-temperature step, for example to form a front surface field (FSF). It is also conceivable to form a non-contacted front side emitter (front floating emitter (FFE)), for example by diffusing-in boron from a borosilicate glass layer on the front side. On the other hand, a specific layer stack composed of a borosilicate glass layer and a phosphosilicate glass layer and also optionally further layers may be deposited on a back side of the silicon substrate. The layer stack serves to provide boron for the laser doping and phosphorus for the furnace diffusion. Separate deposition on the front and back sides makes it possible to separately adjust the glass properties of the phosphosilicate glass layers and tune them to the high-temperature step. Step (ii) is the laser doping and ablation process, already mentioned, in which step for example $p^+$ emitter regions may be generated in the silicon substrate and the phosphorus doping source may be structured for step (iii). In step (iii), the front surface field (FSF) and the back surface field (BSF) may then be formed for example at the same time, with it being possible in addition for any laser damage which has occurred to be healed. The phosphosilicate glass layer applied to the front side may for example remain on the wafer as a multifunctional layer for surface passivation. However, the back side should generally be passivated again, for example by means of thermal oxidation, with it being possible or necessary to remove remaining parts of the glass layer stack beforehand.

According to one embodiment, the first glass layer may be the glass layer of the two glass layers that is closer to the surface of the silicon substrate than the other of the two glass layers, which consequently may be the second glass layer. In other words, the first glass layer may lie between the silicon substrate and the second glass layer. This has the effect of the first region predominantly being doped with the boron from the first glass layer. In this way, the first region may become predominantly p-type doped. In addition, experiments have shown that, at suitable layer thicknesses, the first glass layer in the form of a borosilicate glass layer, i.e. a silicon oxide layer in which boron is incorporated as p-type dopant, may, at sufficiently high temperatures, cause phosphorus from the second glass layer in the form of a phosphosilicate glass layer, i.e. a silicon oxide layer in which phosphorus is incorporated as n-type dopant, to diffuse more strongly into the silicon substrate than when a silicate glass layer not containing any boron, instead of the borosilicate glass layer, is present between the phosphosilicate glass and the silicon substrate. Therein, it has been observed that a borosilicate glass layer having a high boron concentration allows the passage of phosphorus more readily than a borosilicate glass layer having a low boron concentration.

According to one embodiment, the surface of the silicon substrate may first be coated with the first glass layer such that the surface of the silicon substrate and the first glass layer are directly adjacent to one another. There is thus preferably no further layer between the first glass layer and the silicon substrate. In other words, the first glass layer may be applied to the (uncoated) surface of the silicon substrate as the first layer of the layer stack. Accordingly, the second glass layer may subsequently be applied as the second, third or even higher layer of the layer stack. This makes it possible to increase the efficiency of the doping of the first region. In particular, thermal energy, which leads to local heating or local melting during the laser step due to absorption of laser energy in the silicon substrate, may be efficiently transferred to the adjacent first glass layer, in order to likewise locally melt this first glass layer and as a result cause the desired liquid-phase diffusion.

According to one embodiment, the first glass layer and the second glass layer may be directly adjacent to one another. For example, the second glass layer may be applied to a surface of the first glass layer after the first glass layer has been applied. Conversely, it is possible for the first glass layer to be applied to a surface of the second glass layer after the second glass layer has been applied. In both cases, the first glass layer and the second glass layer may be directly adjacent to one another. This promotes diffusion of dopants between the first and second glass layers.

According to one embodiment, the doped first region may be predominantly p-type doped. In addition or alternatively, the doped second region may be predominantly n-type doped. For example, the first region may be p-, $p^+$- and/or $p^{++}$-doped, and/or the second region may be n-, $n^+$- and/or $n^{++}$-doped. It is possible that the first region is additionally weakly n-type doped, for example with the phosphorus from the second glass layer, with this n-type doping being overcompensated by the stronger p-type doping with the boron from the first glass layer. In addition or alternatively, it is possible that the second region is additionally weakly p-type doped, for example with the boron from the first glass layer, with this p-type doping being overcompensated by the stronger n-type doping with the phosphorus from the second glass layer.

According to one embodiment, the layer stack may be applied to a first side of the silicon substrate and in addition a third glass layer containing phosphorus as n-type dopant may be applied to a second side of the silicon substrate, which second side is opposite the first side. Therein, only the first side may be irradiated with the laser radiation. The third glass layer may differ in terms of its properties, for example in its phosphorus content, its density and/or its thickness, from the first and/or second glass layers. The third glass layer may for example be applied directly to a surface of the silicon substrate, on the second side. The heating of the silicon substrate in the furnace may then cause additional solid-state diffusion, in which predominantly phosphorus from the (solid or liquid) third glass sheet diffuses close to the surface into a third region of the (solid) silicon substrate covered by the third glass layer. The third glass layer may be generated in the same coating process as the layer stack composed of the first and the second glass layers. This simplifies the production of a back-contact solar cell.

According to one embodiment, the silicon substrate may be heated in a dopant-free atmosphere. For example, the heating may take place in a protective gas atmosphere, for example a nitrogen atmosphere, or in air. The term “dopant-free” should thus be understood to mean that the atmosphere does not contain any p-type or n-type dopant, for example boron or phosphorus, whatsoever, or only contains a very small inconsequential amount thereof. In other words, the heating may take place in the furnace without adding additional dopant such as boron or phosphorus. This makes it possible to further simplify the doping of the silicon substrate.

According to one embodiment, the layer stack may additionally comprise an oxide layer which may be applied as final layer of the layer stack. In other words, the silicon substrate may be coated such that the first glass layer and the second glass layer, and any optional further layers of the layer stack, lie between the silicon substrate and the oxide layer. The oxide layer may for example be an $SiO_x$ layer or $SiO_x$-containing layer. Such an oxide layer may for example protect against fouling, moisture or other environmental influences.

According to one embodiment, the layer stack may additionally comprise a diffusion barrier layer which acts as a diffusion barrier for the boron out of the first glass layer and/or for the phosphorus out of the second glass layer, in this example. The diffusion barrier layer may comprise one or more individual layers. The diffusion barrier layer may comprise one or more dielectric layers. The dielectric layer may be pure or undoped, for example a pure silicon oxide layer, silicon nitride layer or silicon carbide layer, or aluminum oxide. The diffusion barrier layer may be arranged between the surface of the silicon substrate and the first glass layer, and/or between the first and second glass layers. Chemical properties, for example a composition, and physical properties, for example a thickness, may be suitably adapted in order to influence diffusion barrier properties or filter properties in a desired manner. For example, the individual layers may have filter properties that differ from one another, and/or may be arranged at different locations in the layer stack. It is also conceivable for one of the individual layers to be combined with at least one other of the individual layers to form a composite. The diffusion barrier layer may for example be designed so as to be permeable to boron and phosphorus, but more permeable to boron than to phosphorus. The reverse is however also possible. This makes it possible, for example, during the liquid-phase diffusion in step (ii), to prevent more phosphorus than desired from diffusing into the first region, and/or during the solid-state diffusion in step (iii), to prevent more boron than desired from diffusing into the second region.

According to one embodiment, the first region covered with the layer stack may be divided into at least one first irradiation zone and a second irradiation zone and the first irradiation zone may be irradiated using different laser parameters than in the second irradiation zone. For example, the first irradiation zone may be irradiated at a different fluence or a different degree of spatial overlap of the laser radiation than the second irradiation zone. The first irradiation zone may for example be a central zone of the first region in which the first region is intended to be electrically conductively contacted by means of a suitable contact structure, it being possible for the second irradiation zone to be a marginal region of the first region that adjoins the second region. This makes it possible to generate a selective emitter structure in the first region in a same laser treatment step. Furthermore, a neutrally-doped (i.e. approximately compensating) layer may additionally be generated as a buffer layer between the p-doped region and the n-doped region.

According to one embodiment, a respective layer thickness of the first glass layer and of the second glass layer may be greater than 5 nm, in particular greater than 10 nm, and/or less than 200 nm, in particular less than 60 nm. The first and the second glass layers may be of substantially the same thickness or may differ considerably from one another in terms of their layer thicknesses. It was possible to obtain particularly good results in experiments using glass layers having the aforementioned layer thickness ranges.

In particular, it may be advantageous to design the glass layer of the layer stack that is closer to the silicon substrate to be thicker than the glass layer that is further away from the silicon substrate. Here, the thickness may for example be at least 10%, at least 20%, at least 50% or even at least 100% greater. This makes it possible to support predominantly only the glass layer directly adjoining the silicon substrate being melted during the laser process, while the glass layer thereabove is not melted, or is only melted in smaller sub-regions and/or for a shorter period of time or at a later time. Accordingly, liquid-phase diffusion of dopants takes place predominantly from the glass layer directly adjoining, or closer to, the silicon substrate.

According to one embodiment, the first contact structure and the second contact structure may be formed on the same side of the silicon substrate. This side may in particular be the back side of the solar cell. It is thus not necessary to form any further contact structure on the front side of the solar cell, which is advantageous for the efficiency of the solar cell.

According to one embodiment of the solar cell according to the invention, both the dominant dopant type and the overcompensated dopant type in the first region, within a layer region close to the surface and to a depth of at least 0.05 μm, preferably of at least 0.3 μm, may have dopant concentrations of more than 1e17 $cm^{-3}$. In other words, the dopant concentrations both of the dominant dopant type and of the overcompensated dopant type, down to a significant depth of the silicon substrate, may be considerably above a base doping of the silicon substrate which is typically in a range from 8e13 $cm^{-3}$-1e16 $cm^{-3}$ for n-type substrates and 2e14-4e16 for p-type substrates.

According to one embodiment of the solar cell according to the invention, a doping profile of the dominant dopant type in the first region may have a concentration profile, at least in a region close to the surface which begins 30 nm beneath the surface of the silicon substrate and ends 100 nm beneath the surface of the silicon substrate, in which concentration profile the dopant concentrations are at least three times, preferably at least ten times, those of the dopant concentrations at the same location in a concentration profile of the doping with the overcompensated dopant type.

According to one embodiment of the solar cell according to the invention, in the first region, both the doping profile of the dominant dopant type and the doping profile of the overcompensated dopant type may have a concentration profile which gives a substantially constant dopant concentration at least in the region close to the surface, i.e. between a depth of 30 nm and 100 nm. In this context, the wording "a substantially constant dopant concentration" may mean that the dopant concentration in the region close to the surface decreases by less than 50%, preferably less than 30%, with increasing depth. Such a virtually homogeneous dopant concentration within the region close to the surface typically results due to the liquid-phase diffusion occurring during laser doping, in which dopants may become predominantly homogeneously distributed within the region close to the surface which has briefly melted. In contrast hereto, a dopant concentration resulting from solid-state diffusion typically decreases considerably with increasing distance from the silicon substrate surface and, at a depth of 100 nm, is usually almost an order of magnitude lower than it is close to the substrate surface.

According to one embodiment of the solar cell according to the invention, the dominant dopant type in the first region may be a boron doping, and the overcompensated dopant type in the first region may be a phosphorus doping. In other words, boron doping may dominate in the first region, but phosphorus may nevertheless be present therein at measurable concentrations.

According to one embodiment of the solar cell according to the invention, the second region may have doping with a dominant dopant type which opposes the dominant dopant type of the first region. In other words, the first region may for example be dominantly p-type doped, whereas the second region may be dominantly n-type doped, or vice-versa.

According to one embodiment of the solar cell according to the invention, the doping profile of the dominant dopant type in the second region may have a concentration profile which, at least in a region close to the surface which begins 30 nm beneath the surface of the silicon substrate and ends 100 nm beneath the surface of the silicon substrate, gives a dopant concentration which gradually decreases by at least 50%, preferably by at least 75% or even by at least 85%. In other words—in contrast to the preferably virtually homogeneous profile of the doping concentration within the region close to the surface of the first region—a concentration of dopants may prevail in the second region which, starting from a high concentration close to the surface of the silicon substrate, has already decreased at a depth of 100 nm by at least half, potentially even by one to two orders of magnitude. Such a doping profile with a dopant concentration that decreases very greatly with increasing depth typically results from solid-state diffusion and, in the solar cell described, results in the dopants only being forced into the second region in the context of the high-temperature step and not by laser diffusion.

According to one embodiment of the solar cell according to the invention, the second region may also have doping with an overcompensated dopant type. A doping profile of the dominant dopant type in the second region, in the region close to the surface, has a concentration profile in which the dopant concentrations are at least twice, preferably at least five times, those of the dopant concentrations at the same location of the doping with the overcompensated dopant type. In other words, in the second region, similarly to in the first region, both opposing dopant types may be present, with the overcompensated dopant type being present in considerably lower concentrations than the dominant dopant type. Such properties of the dopant concentrations may thus be due to the fact that one of the dopants contained in the layer stack has considerably different diffusion behavior and/or considerably different solubility in silicon than the other dopant. For example, phosphorus diffuses considerably more greatly into silicon by solid-state diffusion than boron does. Alternatively or in addition, the provision of a selective diffusion barrier layer may lead to one of the dopants entering the silicon more weakly than the other.

It is noted that possible features and advantages of embodiments of the invention are described above and below partly with reference to the doping method, partly with reference to the production method and partly with reference to a solar cell produced in this production method. Those skilled in the art will recognize that features described for individual embodiments may be transferred, adapted and/or exchanged analogously and suitably to other embodiments, in order to arrive at further embodiments of the invention and possibly at synergistic effects.

BRIEF DESCRIPTION OF THE FIGURES

Hereinafter, embodiments of the invention are described with reference to the appended drawings; neither the description nor the drawings are to be interpreted as limiting the invention.

The figures are merely schematic and are not true to scale. The same reference signs in the various figures denote the same or equivalent features.

DETAILED DESCRIPTION

Figure 1:
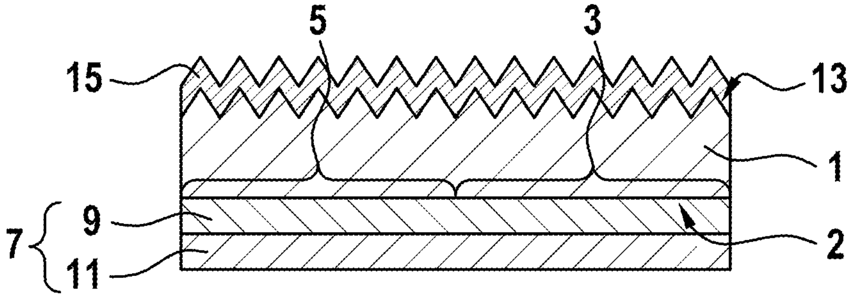
FIG. 1 shows a silicon substrate coated in a doping method according to one embodiment of the present invention.

FIG. 1 shows a silicon substrate 1, here by way of example in the form of an n-type Czochralski silicon wafer having a specific electrical resistance of between 1 Ωcm and 50 Ωcm with (100) crystal orientation. In this example, in a first step, the silicon substrate 1 is coated on its back side 2, with respect to a first region 3 to be doped and a second region 5 to be doped, with a layer stack 7 comprising a first glass layer 9 containing boron as p-type dopant, hereinafter also referred to as borosilicate glass layer 9, and a second glass layer 11 containing phosphorus as n-type dopant, hereinafter also referred to as phosphosilicate glass layer 11.

The borosilicate glass layer 9 is applied to a surface of the silicon substrate 1 such that the borosilicate glass layer 9 and the surface of the silicon substrate 1 are directly adjacent to one another. Subsequently, the phosphosilicate glass layer 11 is applied to the borosilicate glass layer 9, such that the phosphosilicate glass layer 11 and the borosilicate glass layer 9 are directly adjacent to one another. Thus, the borosilicate glass layer 9 is closer to the surface of the silicon substrate 1 than the phosphosilicate glass layer 11.

In addition, in this example, a front side 13 of the silicon substrate 1, which front side is opposite the back side 2, is coated with a third glass layer 15, also containing phosphorus as n-type dopant; this may be an additional phosphosilicate glass layer.

Figure 2:
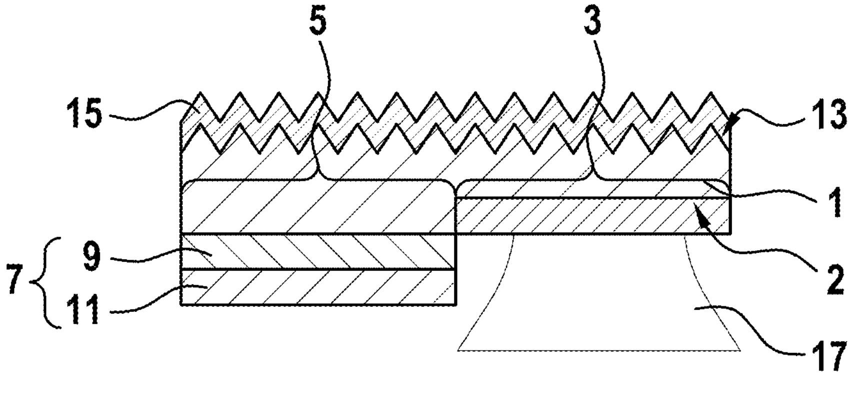
FIG. 2 shows the silicon substrate from FIG. 1, irradiated in a doping method according to one embodiment of the present invention.

After the coating, in a second step, laser doping is carried out, as illustrated in FIG. 2 by way of example. To this end, the back side 2 in the first region 3 is irradiated with laser radiation 17, the parameters of which, in particular the fluence of which, are selected such that, on the one hand, predominantly boron from the borosilicate glass layer 9 diffuses into the first region 3 close to the surface and, on the other hand, the layer stack 7 opposite the first region 3 is removed from the surface of the silicon substrate 1 by laser ablation (see also FIG. 4). The result of this laser treatment is an exposed predominantly p-type-doped first region 3, for example a $p^+$ emitter region. Because the second region 5 is not irradiated with the laser radiation 17, the second region 5 is still covered with the layer stack 7 following irradiation. The front side 13 is also not irradiated with the laser radiation 17.

Figure 3:
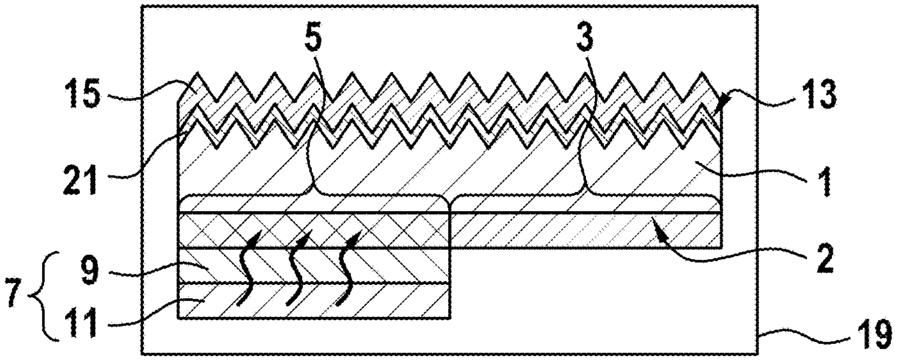
FIG. 3 shows the silicon substrate from FIG. 2, heated in a doping method according to one embodiment of the present invention.

After the irradiation, the silicon substrate 1 doped and structured in this way is heated in a third step, as illustrated in FIG. 3 by way of example. To this end, the silicon substrate 1 is placed in a furnace 19 and heated therein to a specific temperature between 700° C. and 1100° C. In this example, this causes predominantly phosphorus to diffuse out of the phosphosilicate glass layer 11 and into the second region 5 close to the surface. The second region 5 is thus predominantly n-type doped, for example $n^+$ doped.

In addition, in the third step, phosphorus diffuses out of the third glass layer 15 into a third region 21 of the silicon substrate 1 adjoining the front side 13 close to the surface, which third region thus also becomes predominantly n-type doped, for example $n^+$ doped.

The silicon substrate 1 may be heated in a dopant-free atmosphere, i.e. in an atmosphere to which no additional amounts of dopant, in particular of boron or phosphorus, have been added; for example, a nitrogen atmosphere.

Figure 5A:
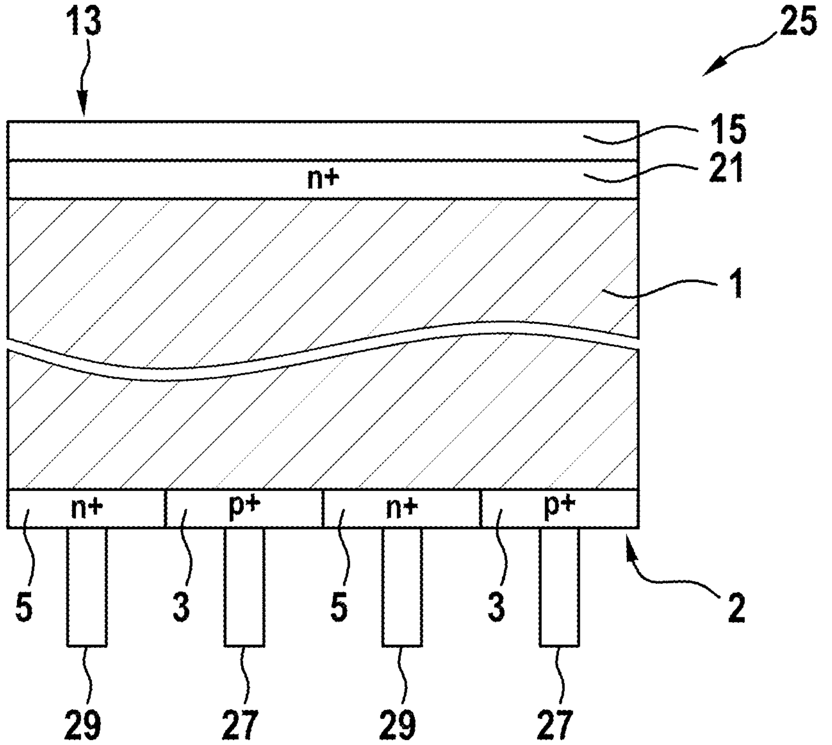
FIG. 5*a* shows a cross-sectional view of a solar cell produced in a production method according to one embodiment of the present invention.

In an optional fourth step, the remaining layer stack 7 may be removed from the back side 2 (see also FIG. 5*a*).

Figure 4:
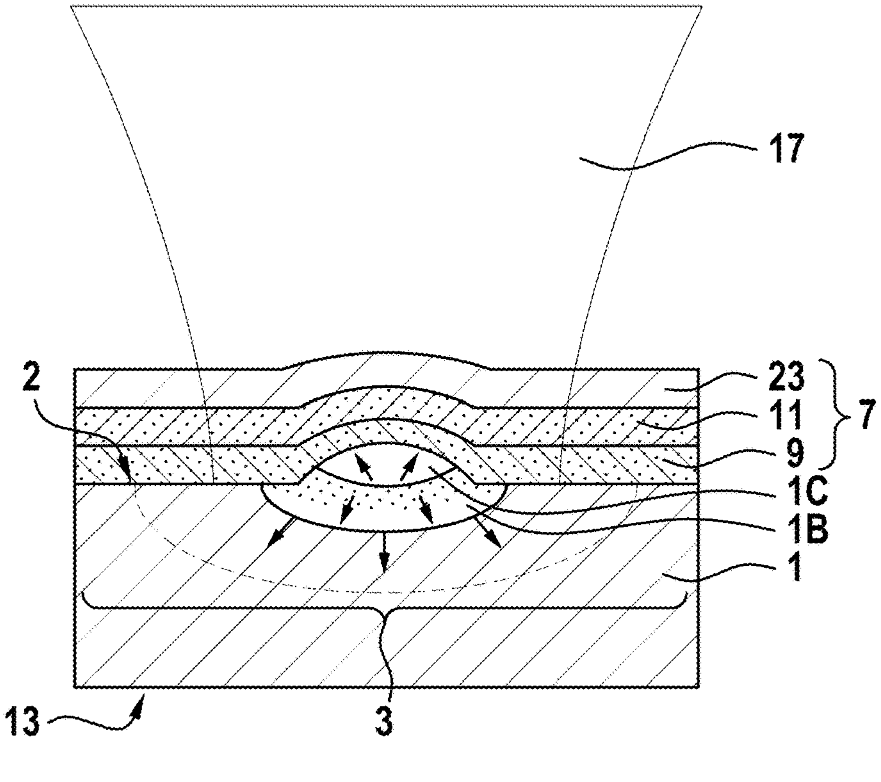
FIG. 4 shows a cross-sectional view of a portion of a silicon substrate irradiated in a doping method according to one embodiment of the present invention.

As may be seen in FIG. 4, it is possible for the layer stack 7 to additionally comprise an oxide layer 23, for example a $SiO_x$ layer. The oxide layer 23 may be applied to the back side 2 as a final layer, such that the borosilicate glass layer 9 and the phosphosilicate glass layer 11 lie between the silicon substrate 1 and the oxide layer 23, and are thus protected thereby. The front side 13 and a third glass layer 15 which is potentially provided there are not shown in FIG. 4.

Figure 10:
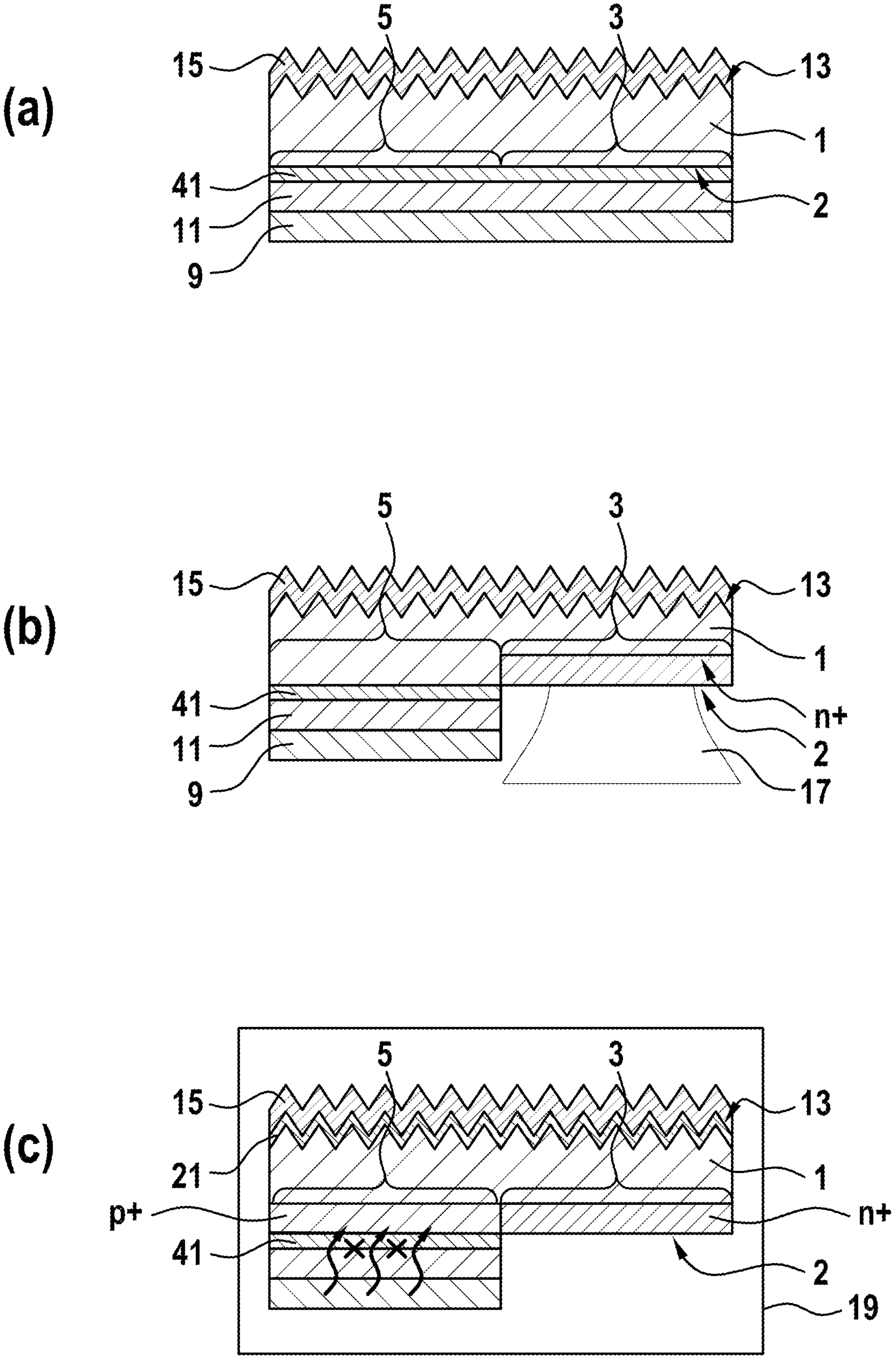
FIGS. 10*a* to 10*c* illustrate a variant of method steps in which, by means of a doping method according to one embodiment of the present invention, an alternative lateral distribution of n-type and p-type regions is generated.

Moreover, depending on the application, the layer stack 7 may comprise one or more diffusion barrier layers 41 (see FIG. 10) which may act as a barrier for the diffusion of boron out of the first borosilicate glass layer 9 and/or for the diffusion of phosphorus out of the second phosphosilicate glass layer 11.

In this example, the individual layers 9, 11, 23 of the layer stack 7 are each designed with a layer thickness of 20 nm, such that the layer stack 7 has an overall thickness of 60 nm. Each layer thickness may also be considerably greater than or less than 20 nm; however, it should be no less than 5 nm and/or no greater than 200 nm.

FIG. 5*a* shows, by way of example, a solar cell 25 having the silicon substrate 1 from FIGS. 1 to 3. In this example, the silicon substrate 1 has, on the back side 2 thereof, which back side here forms a laterally interleaved structure of a back surface field (BSF) and an emitter of an IBC solar cell 25, a plurality of $p^+$ doped first regions 3 and a plurality of $n^+$ doped second regions 5, which are arranged in alternation directly adjacent to one another. Here, the third region 21 facing the front side 13, which third region forms a front surface field (FSF) of the solar cell 25, is also $n^+$ doped and covered with the third glass layer 15.

A first contact structure 27 and a second contact structure 29, each in the form of narrow metal contacts, are formed on the back side 2, wherein the first contact structure 27 only electrically conductively contacts each of the first regions 3 and the second contact structure 29 only electrically conductively contacts each of the second regions 5. The two contact structures 27, 29 are expediently electrically insulated from one another. Conversely, no contact structures are formed on the front side 13, i.e. on the side of the solar cell 25 facing the sun, thereby preventing shadowing.

Figure 5B:
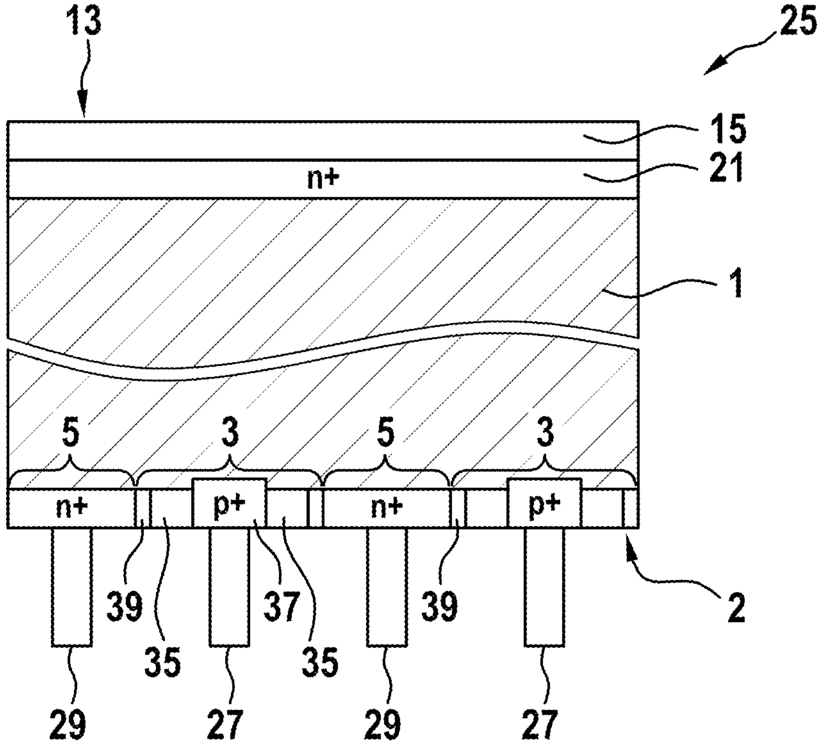
FIG. 5*b* shows a cross-sectional view of a solar cell having a selective emitter structure, produced in a production method according to one embodiment of the present invention.

FIG. 5*b* shows a variant of a solar cell 25 which in many aspects is designed similarly to that of FIG. 5*a*, but in which the first regions 3 are designed with a selective emitter structure. To this end, during the irradiation with the laser radiation 17, the parameters of said laser radiation are varied in time and/or in space such that, on the one hand, in sub-regions which are intended to be contacted by the contact structure 27, a strongly doped and/or more deeply doped p-type region 37 is generated and, on the other hand, in each of laterally adjoining sub-regions, a weakly doped and/or more shallowly doped p-type region 35 is generated. In addition, the laser parameters may be adjusted in a targeted manner such that a buffer region 39 is formed laterally between each of the weakly doped p-type regions 35 of the first region 3 and an adjacent n-doped second region 5, in which buffer region a phosphorus concentration and a boron concentration substantially compensate one another. The buffer region 39 may contribute to reducing recombination losses.

Hereinafter, physical principles of the above-described doping method and experimental results relating thereto will be described in more detail.

The process in which, by means of laser irradiation, both local diffusion of dopants from the layer stack 7 from the glass layers 9, 11 into the surface of the silicon substrate 1 and local ablation of the layer stack 7 take place, is an essential step of the doping method described here. Properties of the laser used in the process should be chosen suitably for achieving the functionalities and physical processes described here. For example, a wavelength of the laser should be suitably chosen so that it leads to absorption of the laser light as close to the surface as possible in the silicon substrate 1. To this end, the laser wavelength may be chosen for example in a range from 355 nm to 1064 nm. Furthermore, the wavelength of the laser should preferably be chosen such that there is no, or only negligible, absorption of the laser light directly into one of the glass layers 9, 11. To this end, the laser wavelength should for example be greater than 200 nm. Furthermore, a fluence, a power density, a spot size, a pulse duration and/or other laser parameters should be chosen suitably such that, on the one hand, a liquid phase forms for long enough in the region of the laser spot to enable sufficient liquid-phase diffusion and, on the other hand, ablation of regions of the layer stack 7 is subsequently caused. For example, using a wavelength of 532 nm, a pulse duration of approximately 40 ns and a fluence in the range from 1 $J/cm^2$ to 10 $J/cm^2$ has been observed to give satisfactory results.

In the process of laser doping, by means of absorbed laser radiation, the crystalline silicon substrate 1 is melted close to the surface, such that liquid-phase diffusion from the glass layers 9, 11 thereabove may begin. The glass layers 9, 11 themselves transmit virtually all the light and are therefore only heated by contact with the absorbent silicon substrate 1. Consequently, the glass layers 9, 11 also melt from the inside out toward the glass-silicon contact surface. The dopant atoms, in this case boron and phosphorus, may diffuse out of the liquefied borosilicate or phosphosilicate glass in a very short period of time of a few microseconds or even only a few nanoseconds and into the liquefied silicon by a depth of a few nanometers or else a few micrometers. This is based on the diffusion coefficients of boron and phosphorus being many orders of magnitude higher in liquid silicon than in crystalline silicon. The liquid and doped silicon subsequently recrystallizes epitaxially, resulting in highly-doped crystalline layers which are in particular suitable as an emitter or back surface field (BSF) for a solar cell.

At the start of the laser irradiation, for example over a time period of 0 to approximately 20 ns, light absorption in the silicon substrate 1 means that the borosilicate glass layer 9 which is in contact with the silicon substrate 1 is heated earlier, and liquefies shortly thereafter, than the phosphosilicate glass layer 11 thereabove which is thus further away from the site of the heat development. In addition, the path for the n-type dopant from the phosphosilicate glass to the silicon substrate 1 is longer than for the p-type dopant. Likewise, ablation processes of the glass layers 9, 11 may occur, which prevent further diffusion from the borosilicate or phosphosilicate glass into the silicon substrate 1. Overall, with suitable laser parameters, this results in the diffusion-in of boron predominating over phosphorus, or the diffusion-in of the dopants from the layer closer to the silicon substrate 1 predominating over the diffusion of the dopants from the layer further away from the silicon substrate 1, such that the p-type doped first region 3 is generated by the laser processing. By correspondingly selecting other process parameters, such as a boron concentration in the borosilicate glass layer 9, a phosphorus concentration in the phosphosilicate glass layer 11 or a layer thickness of each of the two glass layers 9, 11, it is possible to minimize the undesired diffusion of phosphorus in the first region 3.

Optionally, the oxide layer 23 may be applied for protecting the two glass layers 9, 11 from external influences such as air humidity or contamination.

During the laser action, with sufficient energy density (fluence) of the laser radiation 17, it is possible for additional effects such as indirect ablation of the layer stack 7 to occur. This effect may be utilized to remove the layer stack 7 in the processed first region 3 substantially at the same time as the laser doping. In the example shown in FIG. 4, this is the case approximately at a time period between 15 ns and 30 ns after the laser irradiation has begun. This serves to structure the layer stack 7 for the subsequent phosphorus diffusion in the furnace 19. As a result, the phosphorus source in the form of the phosphosilicate glass layer 11 is already removed above the laser-doped first region 3 by the laser process. Thus, no further phosphorus may diffuse-in in the subsequent high-temperature step.

As may be seen in FIG. 4, the borosilicate glass layer 9 is in direct contact with the silicon substrate 1, such that said glass layer is indirectly heated via the silicon substrate 1 during the laser treatment. The crystalline silicon liquefies in a region 1B, and mainly boron diffuses in. Shortly thereafter, a gas bubble 1C forms by vaporization, and the layer stack 7 is ablated because of gas expansion. This desired effect prevents or reduces the further diffusion of phosphorus into the p-type doped first region 3 in the subsequent high-temperature step in the furnace 19.

The ablation process described may also contribute to interrupting further diffusion of phosphorus in a direction toward the substrate during the laser doping, and thus boron diffusion remaining dominant. In addition, the thicker the borosilicate glass layer 9, the weaker the influence of the phosphosilicate glass 11 thereabove during the laser doping. Ideally, the layer thickness of the borosilicate glass layer 9 is chosen such that the phosphorus may diffuse at best in very small amounts as far as the silicon substrate 1 in the time period before ablation occurs.

A suitable choice of the laser parameters may optionally make it possible to generate a selective emitter structure by forming the boron emitter deeper and/or with an increased boron concentration, for example by increasing the fluence and/or the spatial degree of overlap of the laser pulses, in a metallization region in which for example the first contact structure 27 is to be formed later. Conversely, the first region 3 close to the lateral p-n junction may be very weakly doped in order to reduce charge carrier recombination at this location. Alternatively or in addition, locally weaker doping may also be achieved by using an additional laser with shorter pulses (picosecond or femtosecond laser), because then only ablation will take place, with virtually no doping.

In order to generate n-type doped second regions 5 which are arranged complementarily to the p-type doped first regions 3 formed by laser doping, a subsequent high-temperature step in the furnace 19 is suitable, in this case under a nitrogen atmosphere.

Phosphorus becomes mobile starting at temperatures of approximately 800° C. and may then diffuse into the silicon substrate 1. Conversely, considerably higher temperatures are required for sufficient diffusion of boron. In addition, borosilicate glass is substantially more permeable to phosphorus than pure $SiO_x$ and the glass transition temperature is reduced for borosilicate glass; see: Kern, W. and Schnable, G. L., Chemically Vapor-Deposited Borophosphosilicate Glasses for Silicon Device Applications, RCA Rev., 1982, vol. 43, no. 3, pages 423-457. In this example, the different diffusion properties of phosphorus and boron are used to force phosphorus through the borosilicate glass layer 9 and into the silicon substrate 1 and thus to generate the n-type doped second region 5. A suitable process temperature makes it possible to keep the undesired diffusion of boron low, such that the second region 5 is ultimately predominantly n-type doped. The first region 3 is only influenced to a minor extent by the high-temperature step, since the layer stack 7 has already been ablated here. At the same time, potential laser damage in the first region 3 may be healed. Eventually, laterally-arranged p- and n-doped regions are formed, such as those required for example for IBC cells.

In addition, a front-surface field (FSF) may be formed in this high-temperature step. A front floating emitter (FFE) on the front side 13 is also conceivable, by applying a further borosilicate glass layer to the front side as the third glass layer 15. The dopant content of the third glass layer 15 may be chosen independently of the layer stack 7 on the back side 2, representing an advantage compared to conventional doping methods based on $POCl_3$.

Experimental results regarding the above-described generation of lateral p-n junctions are summarized below.

As mentioned above, p-type Czochralski silicon wafers having a specific electrical resistance of between 1 Ωcm and 8 Ωcm and (100) crystal orientation were used in the experiments. However, the base doping has no role here in assessing practicability. Saw damage was back-etched and the surface was chemically polished and cleaned. The smooth surface of the samples is not mandatory; however, it does enable precise measurement of the layer thicknesses by means of ellipsometry and precise depth profile analysis of the glass layers 9, 11 by means of glow discharge optical emission spectroscopy (GD-OES). The layer stack 7 including the oxide layer 23 in the form of a $SiO_x$ capping layer was deposited using atmospheric pressure chemical vapor deposition (APCVD). In the process, the boron and phosphorus contents were varied for the various process groups. Subsequently, a part of the sample surface of each sample was laser treated in order to generate the p-type doped first region 3 there. The laser radiation 17 used for the laser doping had a wavelength of 532 nm and a temporal pulse width of approximately 40 ns. To produce the n-type doped second region 5, the samples were subsequently subjected to a high-temperature step in the furnace 19 at two different process temperatures, namely 850° C. and 925° C.

After the laser treatment and the high-temperature step, the sheet resistances (given in FIGS. 6 and 7) were measured by means of four-point measurement in the different regions 3, 5. However, the sheet resistance measurement alone is not enough to make any certain statements about the type of doping. In addition, the sheet resistance of the p-type doped second region 3 is distorted by the p-type doped base thereunder; however, it was possible to correct this.

Doping profiles were recorded using electrochemical capacitance-voltage (ECV) measurements, giving information about the profile of the electrically active doping. The polarity of the effective doping may also be determined therefrom. Here, the effective doping is measured as the difference between electrically active p-type and n-type doping. The lateral p-n junctions were also detected using a voltage scanner (CoRRe scanner). Here, light is used to induce free charge carriers in the semiconductor material, and the potential difference between the top and bottom sides is measured locally using a thin sliding contact. If there is a p-n junction at depth, a voltage is established between the measurement point and the back contact. For these measurements, the layer stack 7 was removed beforehand using hydrofluoric acid. SIMS measurements were also carried out, in which both boron and phosphorus atoms were measured at the same time in order to investigate boron impurities in the $n^+$ region and phosphorus impurities in the $p^+$ region.

Figure 6:
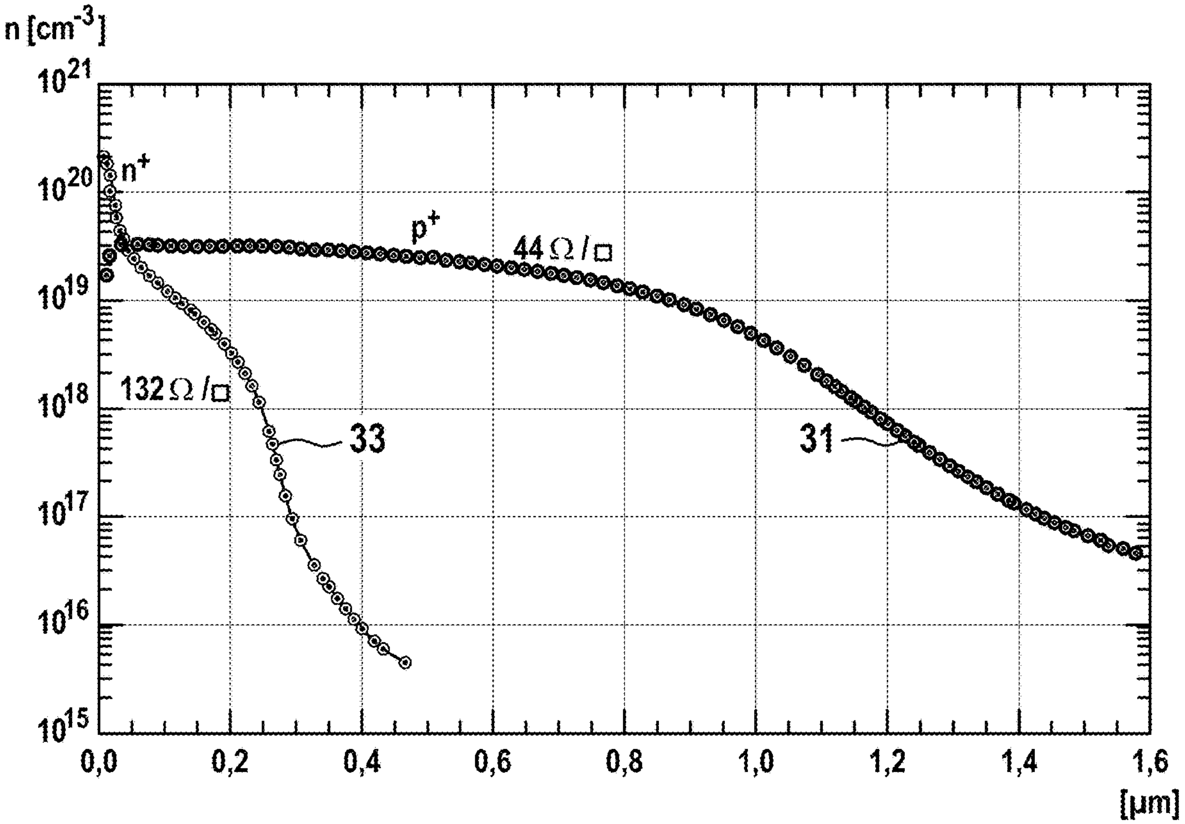
FIG. 6 shows doping profiles of two differently-doped regions of the solar cell from FIG. 5*a*.

FIG. 6 shows, by way of example, a $p^+$ doping profile 31 assigned to the first region 3 and an $n^+$ doping profile 33 assigned to the second region 5, for a nominal phosphorus content in the phosphosilicate glass layer 11 of 6%, a nominal boron content in the borosilicate glass layer 9 of 6%, and a temperature of 850° C. in the furnace 19. The x-axis plots the penetration depth of each dopant, boron or phosphorus, in μm; the y-axis plots the dopant concentration n in $cm^{-3}$. The dopant concentrations in the glass layers, stated in FIG. 6, were estimated theoretically on the basis of the gas flows used for the vapor deposition apparatus, and may differ considerably from the actual mass percentage contents of the borosilicate glass layer 9 and of the phosphosilicate glass layer 11. Nevertheless, they permit qualitative comparisons to be made between the individual glass formulations.

Both doping profiles 31, 33 have a sufficient surface concentration for contacting by means of commercial screen-printing pastes. The penetration depth and the form of the p-type doping profile 31 may be varied by adjusting the laser parameters used, for example to form a selective emitter structure.

Figure 7:
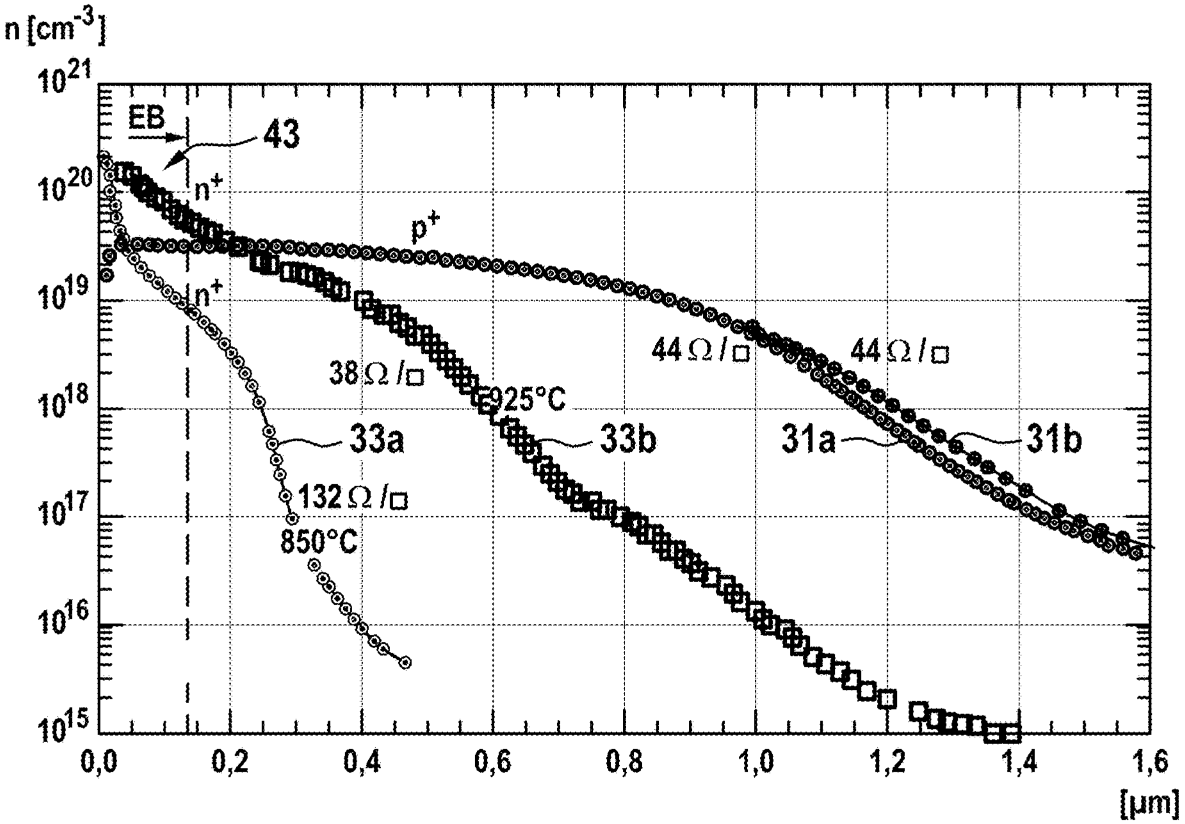
FIG. 7 shows doping profiles of two differently-doped regions of the solar cell, such as are generated at two different temperatures in a high-temperature step.

FIG. 7 illustrates $p^+$ doping profiles 31*a*, 31*b* and $n^+$ doping profiles 33*a*, 33*b*, which were generated using the doping method described here at different temperatures $T_a$=850° C. or $T_b$=925° C. during the high-temperature step in the furnace 19. It should be noted that, at the higher temperature $T_b$, particularly the n-type doping profile 33*b* penetrates deeper into the silicon substrate than at the lower temperature $T_a$. However, the qualitative profile of the $n^+$ doping profiles 33*a*, 33*b* remains similar, in particular in terms of a very highly doped kink region 43 down to approximately 0.1 μm starting from the substrate surface. When required, for example to reduce recombination losses, this kink region 43 may be subsequently removed by back etching of the substrate surface (illustrated by a vertical dashed line in FIG. 7 labeled "EB" for "etch back").

The measurements showed that, as expected, the sheet resistance in the second regions 5 decreases with increasing phosphorus content in the phosphosilicate glass layer 11. A higher diffusion temperature also led to considerably lower sheet resistances because more phosphorus may diffuse in as a result. The dependency of the n-type doping on the boron content of the borosilicate glass 9 initially appears less intuitive to interpret. In this case, a higher boron content also led to a decreased sheet resistance, although the additional boron atoms, as p-type dopant, should actually have partially compensated the n-type doping. However, an increased boron content also leads to increased diffusion of phosphorus through the borosilicate glass layer 9. Comparison with a pure $SiO_x$, i.e. quartz glass, layer which was used instead of the borosilicate glass layer 9 demonstrated clearly that $SiO_x$ is indeed an effective phosphorus diffusion barrier, and it is the boron that makes the oxide permeable to phosphorus. One argument to explain this behavior is the considerably reduced melting point or glass transition temperature of borosilicate glass compared to pure quartz glass. As the glasses become increasingly soft, the diffusivity of impurity atoms such as boron or phosphorus also increases. The more boron present in the glass, the softer and more permeable the glass will therefore become to phosphorus at a given temperature.

The sheet resistances of the p-type doped first regions 3 increased in average with increasing phosphorus content. This may be explained by the fact that a small proportion of the phosphorus diffuses through the borosilicate glass layer 9 during the laser doping, and thus a corresponding proportion of the p-type doping is compensated. This compensation effect increases with increasing phosphorus content. Consistently, the sheet resistance of the first regions 3 lowers with increasing boron content, because more boron atoms are available for the concentration-dependent liquid-phase diffusion. The subsequent high-temperature step at higher temperatures of around 925° C. lowers the sheet resistance compared to lower temperatures of around 850° C., suggesting a redistribution and possible activation of inactive boron.

Figure 8:
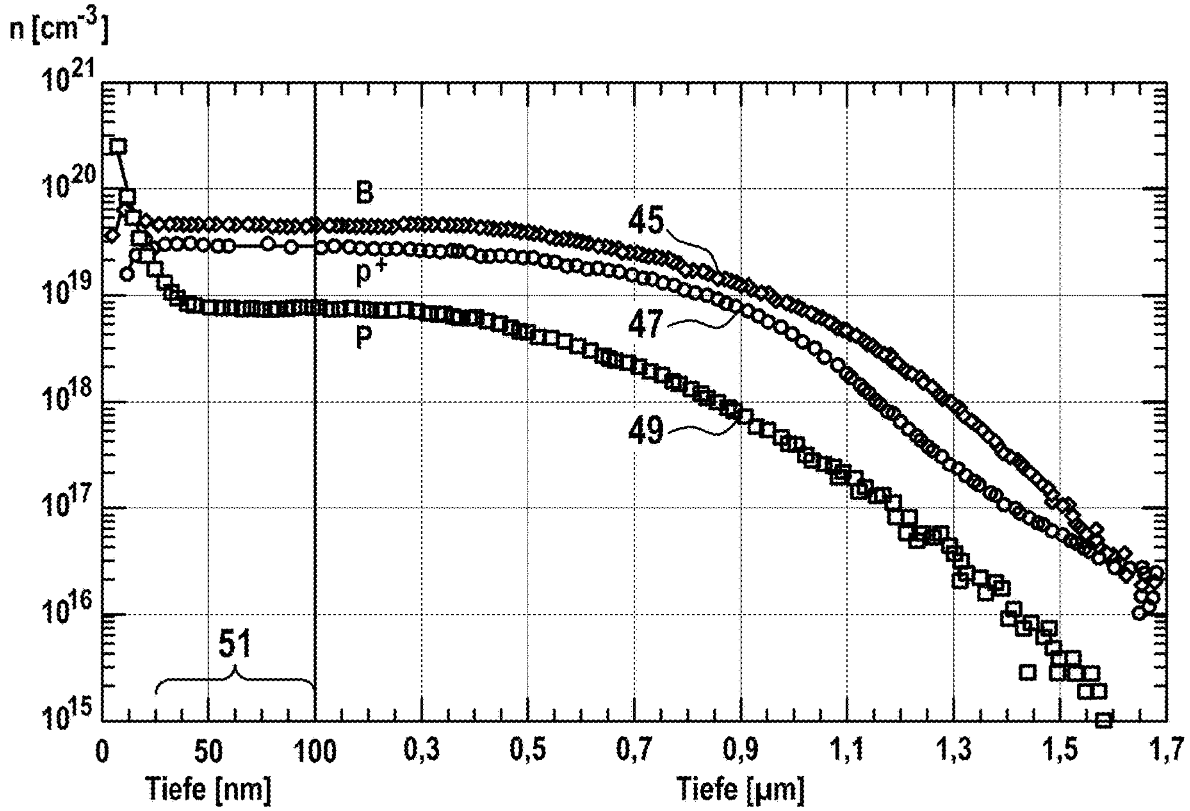
FIG. 8 shows a doping profile of boron and phosphorus within a first region of a silicon substrate doped according to the invention.

FIG. 8 illustrates doping profiles determined using ECV measurements or SIMS measurements in a first region 3 of a solar cell 25 produced according to the invention (see FIGS. 5*a* and 5*b*). A concentration profile 45 of boron as dominant dopant type, measured by means of SIMS, corresponds well here to a concentration profile 47 of the p-type doping with boron, measured by means of ECV. The concentrations of boron here are approximately constant down to a depth of approximately 0.3 μm and are considerably greater than 2e19 $cm^{-3}$. Furthermore, the concentrations of boron within a region 51 close to the surface between 30 nm and 100 nm beneath the surface of the silicon substrate 1 are higher by at least a factor of 3 than the concentrations of phosphorus, as overcompensated dopant type, in a concentration profile 49 measured by means of SIMS.

Figure 9:
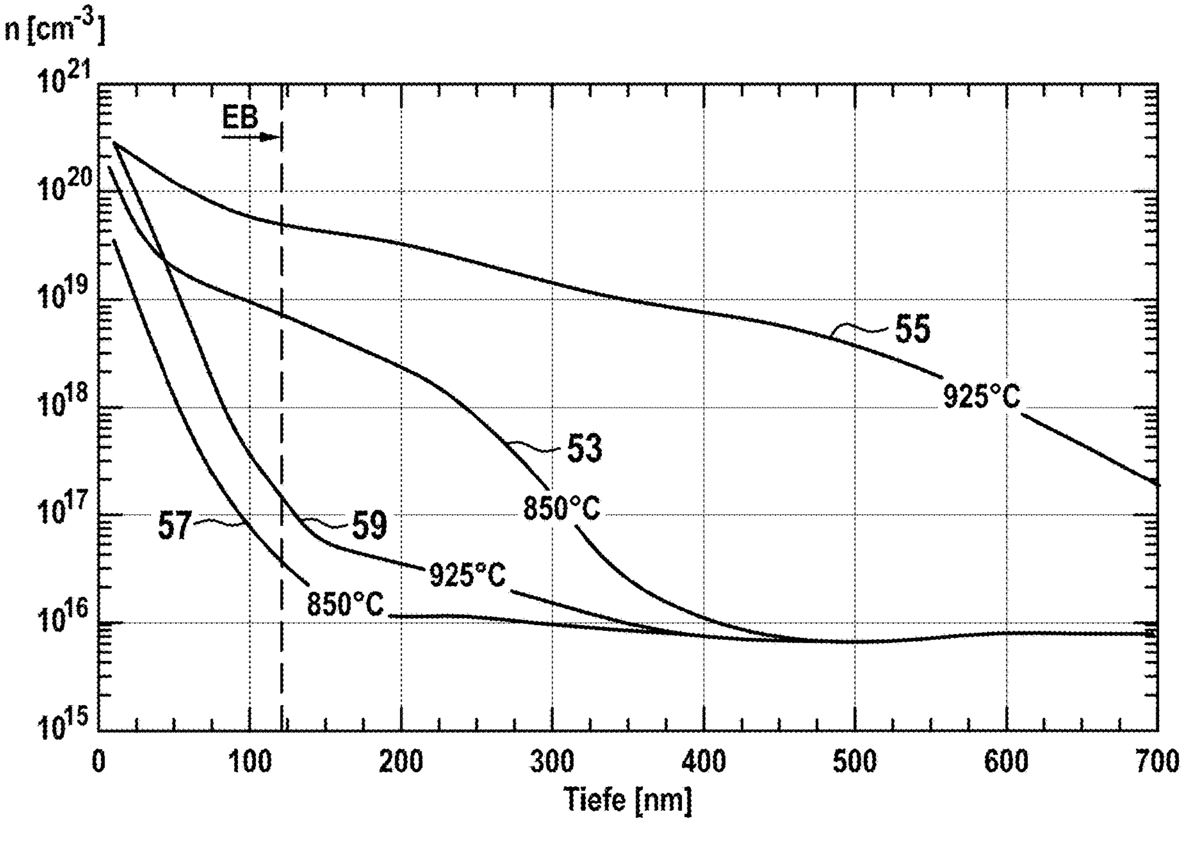
FIG. 9 shows a doping profile of boron and phosphorus within the second region of the silicon substrate doped according to the invention.

FIG. 9 illustrates doping profiles determined using ECV measurements or SIMS measurements in a second region 5 of a solar cell 25 produced according to the invention. A concentration profile 53 here gives a phosphorus concentration as was generated in a high-temperature step at 850° C., whereas a concentration profile 55 gives a phosphorus concentration as was generated in a high-temperature step at 925° C. A concentration profile 57 further gives a boron concentration as was generated in a high-temperature step at 850° C., whereas a concentration profile 59 gives a boron concentration as was generated in a high-temperature step at 925° C. It may be seen that the concentration profiles 53, 55, 57, 59 generated by solid-state diffusion in the second region 5 differ fundamentally from the concentration profiles 45, 47, 49 generated by liquid-phase diffusion in the first region 3 and illustrated in FIG. 8; in particular, the concentrations greatly decrease with increasing distance from the surface of the silicon substrate 1. However, similarly to the first regions 3, both phosphorus and boron may also be measured as dopant types in the second region 5, wherein in the second regions 5, in contrast to the first regions 3, phosphorus occurs as the dominant dopant type.

The above-described experimental results may be considered sufficient evidence of the practicability of the above-described doping method. In particular, it was possible to show that, by a suitable combination of the process parameters, the above-described doping method made it possible to generate contactable and sufficiently electrically conductive p emitter profiles and n-doped BSF doping profiles which are suitable for use in IBC solar cells. Of course, the form of the doping profiles 31, 33 may be further optimized and adjusted to the desired use by appropriately varying the process parameters.

To conclude, a variant of a doping method according to the invention will be explained with reference to FIGS. 10*a* to 10*c*. In this variant, unlike in the example explained above, rather than a borosilicate glass layer 9, a phosphosilicate glass layer 11 is deposited on the surface of the silicon substrate 1 and only thereafter, and adjoining same, follows the borosilicate glass layer 9; in other words, the sequence of glass layers 9, 11 is reversed. In addition, a selective diffusion barrier layer 41 is located between the phosphosilicate glass layer 11 and the surface of the silicon substrate 1.

During the laser doping (see FIG. 10*b*), predominantly phosphorus is forced from the phosphosilicate glass layer 11 into the silicon surface, resulting in $n^+$ doping in the first region 3 close to the surface. The diffusion barrier layer 41 remains mostly ineffective during the laser doping.

During the solid-state diffusion in the high-temperature step (see FIG. 10*c*), predominantly boron is forced from the borosilicate glass layer 9 into the silicon surface, since the phosphorus from the phosphosilicate glass layer 11 is prevented from diffusing in by the selective diffusion barrier layer 41. Accordingly, dominant $p^+$ doping occurs in the second region 5.

To conclude, reference is made to the fact that terms such as "having", "comprising", etc. do not exclude the presence of other elements or steps, and terms such as "one" or "a" do not exclude the presence of a plurality. Furthermore, reference is made to the fact that features or steps which have been described with reference to one of the exemplary embodiments above may also be used in combination with features or steps which have been described with reference to another of the exemplary embodiments above. Reference signs in the claims are non-limiting.

LIST OF REFERENCE SIGNS

1 Silicon substrate
1B Liquefied region
1C Gas bubbles
2 Back side
3 First region
5 Second region
7 Layer stack
9 First glass layer, borosilicate glass layer
11 Second glass layer, phosphosilicate glass layer
13 Front side
15 Third glass layer
17 Laser radiation
19 Furnace
21 Third region
23 Oxide layer
25 Solar cell
27 First contact structure
29 Second contact structure
31 p-type doping profile
33 n-type doping profile
35 Weakly and shallowly doped p-type region
37 Strongly and deeply doped p-type region
39 Compensated doped buffer region
41 Diffusion barrier layer
43 Kink region
45 Boron concentration profile, measured by SIMS
47 Boron concentration profile, measured by ECV
49 Phosphorus concentration profile, measured by SIMS
51 Region close to the surface
53 Concentration profile of phosphorus at 850° C.
55 Concentration profile of phosphorus at 925° C.
57 Concentration profile of boron at 850° C.
59 Concentration profile of boron at 925° C.

The invention claimed is:

1. A method for doping a silicon substrate, wherein the method comprises:

coating a surface of the silicon substrate with a layer stack composed of at least two glass layers such that the layer stack at least covers a first region to be doped and a second region to be doped of the silicon substrate, wherein the layer stack comprises a first glass layer containing boron as p-type dopant and a second glass layer containing phosphorus as n-type dopant;

irradiating the first region covered with the layer stack with laser radiation in a common laser treatment step such that dopant predominantly from the glass layer of the two glass layers that is closer to the surface of the silicon substrate than the other of the two glass layers is introduced into the silicon substrate close to the surface such that an amount of dopant transferred from the glass layer that is closer to the surface of the silicon substrate is substantially larger than an amount of dopant transferred from the other of the two glass layers into the silicon substrate and therefore dominates properties of the region of the silicon substrate doped therewith, and, in the same laser treatment step, the layer stack is ablated in order to obtain a doped first region from which the layer stack is ablated, wherein the second region covered with the layer stack is not irradiated with the laser radiation and thus the layer stack is not ablated in said second region; and subsequently heating the silicon substrate in a furnace to a temperature of at least 700° C., such that dopant predominantly from one of the two glass layers is introduced into the silicon substrate close to the surface, in order to obtain a doped second region, the doping of which differs with regard to its polarity and/or doping concentration from a doping of the doped first region.

2. The method according to claim 1, wherein the first glass layer is the one of the two glass layers that is closer to the surface of the silicon substrate than the other of the two glass layers, and the other of the two glass layers is the second glass layer.

3. The method according to claim 1, wherein the surface of the silicon substrate is coated with the first glass layer such that the surface of the silicon substrate and the first glass layer are directly adjacent to one another.

4. The method according to claim 1, wherein the first glass layer and the second glass layer are directly adjacent to one another.

5. The method according to claim 1, wherein the doped first region is predominantly p-type doped; and/or wherein the doped second region is predominantly n-type doped.

6. The method according to claim 1, wherein the layer stack is applied to a first side of the silicon substrate and in addition a third glass layer containing phosphorus as n-type dopant is applied to a second side of the silicon substrate, which second side is opposite the first side;

wherein only the first side is irradiated with the laser radiation.

7. The method according to claim 1, wherein the silicon substrate is heated in a dopant-free atmosphere.

8. The method according to claim 1,
wherein the layer stack additionally comprises an oxide layer which is applied as a final layer of the layer stack.

9. The method according to claim 1,
wherein the layer stack additionally comprises a diffusion barrier layer which acts as a diffusion barrier for the boron of the first glass layer and/or for the phosphorus of the second glass layer.

10. The method according to claim 1,
wherein the first region covered with the layer stack is divided into at least one first irradiation zone and a second irradiation zone and irradiation is carried out using different laser parameters in the first irradiation zone than in the second irradiation zone.

11. The method according to claim 1,
wherein a respective layer thickness of the first glass layer and of the second glass layer is greater than 5 nm and/or less than 200 nm.

12. A method for producing a solar cell, wherein the method comprises:
providing a silicon substrate comprising a doped first region and a doped second region, wherein the silicon substrate was doped in a method according to claim 1;
forming a first contact structure which electrically conductively contacts the doped first region; and
forming a second contact structure which electrically conductively contacts the doped second region.

13. The method according to claim 12,
wherein the first contact structure and the second contact structure are formed on a same side of the silicon substrate.

* * * * *